United States Patent [19]

Ishihara

[11] Patent Number: 5,743,699
[45] Date of Patent: Apr. 28, 1998

[54] APPARATUS AND METHOD FOR TRANSFERRING WAFERS

[75] Inventor: Katsuhiro Ishihara, Kawasaki, Japan

[73] Assignee: Fujitsu Limited, Kawasaki, Japan

[21] Appl. No.: 711,002

[22] Filed: Sep. 11, 1996

[30] Foreign Application Priority Data

Dec. 19, 1995 [JP] Japan ................... 7-330514

[51] Int. Cl.[6] .................................................. B65G 49/07
[52] U.S. Cl. ..................... 414/417; 414/938; 414/786; 414/404; 118/500
[58] Field of Search ..................... 118/719, 500; 414/416, 417, 403, 404, 935, 936, 937, 938, 422, 939, 940, 941, 786; 269/20, 55, 902

[56] References Cited

U.S. PATENT DOCUMENTS

| 4,840,530 | 6/1989 | Nguyen | 414/417 X |
|---|---|---|---|
| 4,902,186 | 2/1990 | Akagawa | 414/417 |
| 5,125,784 | 6/1992 | Asano | 414/417 X |
| 5,188,499 | 2/1993 | Tarng et al. | 414/417 X |
| 5,299,901 | 4/1994 | Takayama | 414/417 X |
| 5,374,153 | 12/1994 | Nishi | 414/222 X |

FOREIGN PATENT DOCUMENTS

| 149152 | 7/1987 | Japan | 414/417 |
|---|---|---|---|
| 295435 | 11/1989 | Japan | 414/938 |
| 243427 | 9/1990 | Japan | 414/938 |
| 209845 | 9/1991 | Japan | 414/222 |
| 273662 | 12/1991 | Japan | 414/938 |

Primary Examiner—Frank E. Werner
Attorney, Agent, or Firm—Nikaido, Marmelstein, Murray & Oram LLP

[57] ABSTRACT

A wafer transferring apparatus for transferring a plurality of wafers from a first carrier to a second carrier, while the materials are maintained in their predetermined upright arrangement parallel to each other at a predetermined pitch. Each of the first and second carriers accommodates the wafers in a predetermined upright arrangement. A transporting section has a supporting member providing with a plurality of guide grooves arranged at a pitch the same as the predetermined pitch for moving the plurality of wafers up and down between a lowered position and a raised position. The guide grooves of the supporting member are engaged with upper peripheral portions of the respective wafers when the wafers are moved upward or downward. A holding section temporarily holds the plurality of wafers when the plurality of wafers are in their raised position. An inclination restricting member is provided with guide grooves for restricting the upper peripheral portions of the respective wafers to prevent the wafers being inclined when the wafers are moved upward or downward.

11 Claims, 3 Drawing Sheets

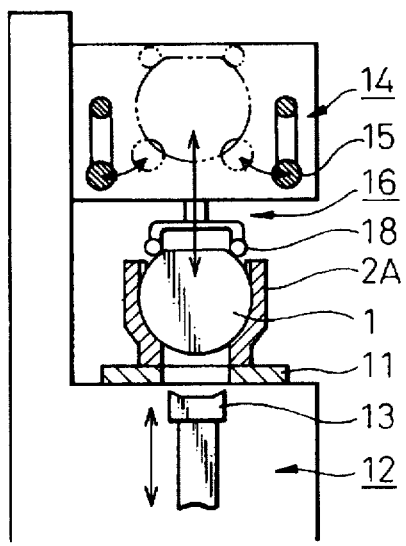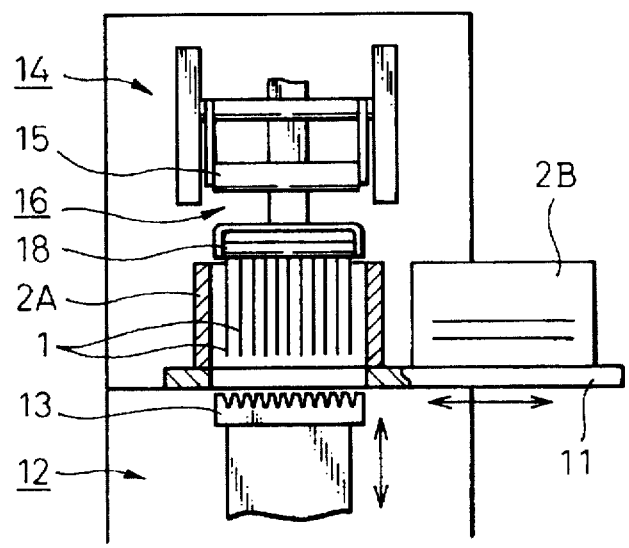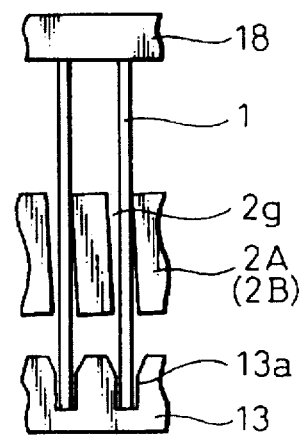

Fig.5(A)
(Prior Art)
Fig.5(B)
(Prior Art)
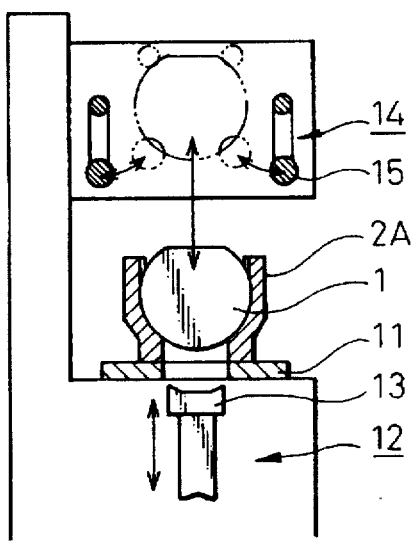
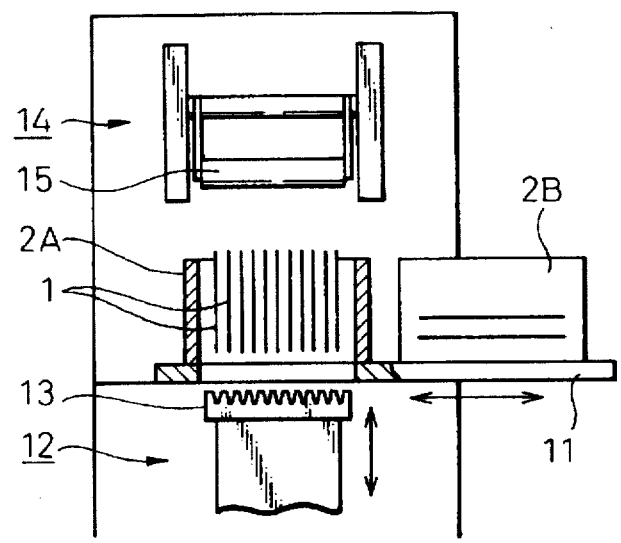

APPARATUS AND METHOD FOR TRANSFERRING WAFERS

BACKGROUND OF THE INVENTION

1. Field of the Invention

The present invention relates to a wafer transferring apparatus in which a plurality of wafers or wafer-like materials, hereinafter simply referred to as "wafers", accommodated in a first carrier are transferred, in one operation, into a second carrier. The present invention also relates to a method for transporting such wafers.

2. Description of the Related Art

In a process for making semiconductor devices, a plurality of wafers are handled and treated while accommodated in one carrier. On some occasions, however, it is necessary to transfer these wafers to a second carrier, the material or shape of which is different from that of the first carrier. For example, in a cleaning step, a CVD step or the like (in particular, in case of a batch type process), it is necessary to transfer the wafers from a first, transporting carrier made of polypropylene to a second carrier, which may be a bucket or boat, which is made of fluororesin or silica glass. It is also necessary to transfer the wafers back to the first carrier. In these cases, a wafer transferring apparatus is used.

A conventionally known wafer transferring apparatus and wafer transferring method will now be described with reference to FIGS. 5(A) and 5(B), in which FIG. 5(A) is a side elevational view of a wafer transferring apparatus known in the prior art and FIG. 5(B) is a front view thereof.

Each of first and second carriers 2A and 2B has a plurality of guide grooves for accommodating a plurality of wafers 1 in their upright standing positions parallel to each other at a predetermined pitch. A wafer transporting section 12 and a wafer holding section 14 have a wafer supporting member 13 and a wafer holding member 15, respectively, and each has a plurality of guide grooves having the same pitch as the pitch of the guide grooves of the first and second carriers 2A and 2B, respectively.

First, both the first carrier 2A, i.e., the carrier accommodating a plurality of wafers 1 which are to be transferred therefrom, and the second carrier 2B, i.e., the carrier to which the above-mentioned plurality of wafers 1 are to be transferred, are placed on a reciprocating table 11. The reciprocating table 11 is moved so that the first carrier 2A comes into a predetermined position above the wafer supporting member 13 which is located at a home position. In this state, the wafer supporting member 13 is raised so that all of the wafers 15 in the first carrier 2A are caught by the wafer supporting member 13 and further moved upward thereby. Thus, when these wafers 15 are held by the wafer holding member 14, the wafer supporting member 13 is moved downward to its home position.

Then, the reciprocating table 11 is moved so that the second carrier 2B comes into the predetermined position above the wafer supporting member 13. In this state, the wafer supporting member 13 is raised again. After all of the wafers 15 held by the wafer holding member 14 are placed onto the wafer supporting member 13, the supporting member 13 is lowered. While the wafers are lowered, the wafers 15 are caught by the second carrier 2B and the wafer supporting member 13 is returned to its home position. Thus, the transfer of wafers is completed.

In the conventionally known wafer transferring apparatus as mentioned above, when the wafers are transported by the wafer transporting section, the wafers are only supported by their lowermost peripheral portions. In addition, since the wafer transporting section is made so that the guide grooves thereof are sufficiently wider than wafers themselves, the wafers may be somewhat inclined. As the results, when the wafers are moved upward or downward, the peripheral portions of the wafers may touch the side walls of the carrier guide grooves and the surfaces of the wafers may be scuffed or damaged, thereby sometimes generating dust.

SUMMARY OF THE INVENTION

An object of the present invention is to provide a wafer transferring apparatus in which the peripheral portions of the wafers are prevented from touching the side walls of the carrier guide grooves when the wafers are transported.

Another object of the present invention is to provide a wafer transferring apparatus in which the above-mentioned drawbacks as mentioned with reference to the conventionally known apparatus can be overcome.

According to the present invention, there is provided a wafer transferring apparatus for transferring a plurality of wafer-like materials from a first carrier to a second carrier, while said materials are maintained in their predetermined upright arrangement parallel to each other at a predetermined pitch, the apparatus comprising: the first and second carriers each having means for accommodating the materials in the predetermined upright arrangements; a transporting section having a supporting means providing with a plurality of guide grooves arranged at a pitch the same as the predetermined pitch for moving up and down the plurality of materials between a lowered position and a raised position, the guide grooves of the supporting means being engaged with first peripheral portions of the respective materials when the materials are moved upward or downward by the transporting section; a holding section for temporarily holding the plurality of materials when the plurality of materials are in their raised position; and an inclination restricting means providing with means for restricting second peripheral portions of the respective materials to prevent the materials being inclined when the materials are moved upward or downward by the transporting section.

Each of the first and second carriers has a central bottom opening through which the supporting means can be moved up and down, and the first and second peripheral portions are lower and upper peripheral portions, respectively, of the respective materials.

The inclination restricting means is provided with a plurality of guide grooves arranged at a pitch the same as the predetermined pitch, so that the guide grooves of the inclination restricting means are engaged with the upper peripheral portions of the respective materials to prevent the materials being inclined when the materials are moved upward or downward by the transporting section.

The inclination restricting means is provided with a rod-like pushing means, so that the rod-like pushing means is in contact with the upper peripheral portions of the respective materials to prevent the materials being inclined when the materials are moved upward or downward by the transporting section.

The rod-like pushing means is made, at least at an outer portion thereof, of an elastic material.

The apparatus further comprises a horizontal table for horizontally moving the first and second carriers to change them from one to another at a predetermined position.

According to another aspect of the present invention, there is provided a method for transferring a plurality of wafer-like materials from a first carrier to a second carrier, while the materials are maintained in their predetermined upright arrangements parallel to each other at a predetermined pitch, the method comprising the following steps of: moving the plurality of materials upward from the first carrier to a raised position by a supporting means providing with a plurality of guide grooves which are engaged with first peripheral portions of the respective materials when the materials are moved upward; temporarily holding the plurality of materials when the plurality of materials are in their raised position; moving the plurality of materials downward from a raised position to the second carrier by the supporting means in such a manner that the guide grooves are engaged with first peripheral portions of the respective materials when the materials are moved downward; and restricting the second peripheral portions of the respective materials to prevent the materials being inclined when the materials are moved upward or downward by the transporting section.

The supporting means is moved up and down through a central bottom opening of the first and second carriers, and the first and second peripheral portions are lower and upper peripheral portions, respectively, of the respective materials.

The upper peripheral portions of the respective materials are engaged with a plurality of guide grooves of an inclination restricting means when the materials are moved upward or downward.

The upper peripheral portions of the respective materials are in contact with rod-like pushing means when the materials are moved upward or downward.

The method further comprises the following steps of: placing the first carrier in which the plurality of wafer-like materials are accommodated in the predetermined upright arrangements at a predetermined position, before the plurality of materials are moved upward; and replacing the second carrier in which no materials are accommodated by the first carrier after the plurality of materials are moved upward and before the plurality of materials are moved downward.

BRIEF DESCRIPTION OF THE DRAWINGS

FIGS. 3(A) and 3(B) are side and front views of a second embodiment of a wafer transferring apparatus according to the present invention;

FIG. 4 is a view illustrating an operation of the second embodiment of a wafer transferring apparatus shown in FIGS. 3(A) and 3(B); and FIGS. 5(A) and 5(B) are side and front views of a conventionally known wafer transferring apparatus.

DETAILED DESCRIPTION OF THE EMBODIMENTS

Figure 1A:
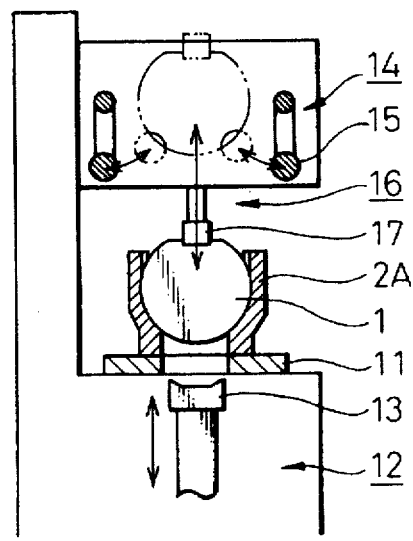
FIGS. 1(A) and 1(B) are side and front views of a first embodiment of a wafer transferring apparatus according to the present invention.
Figure 1B:
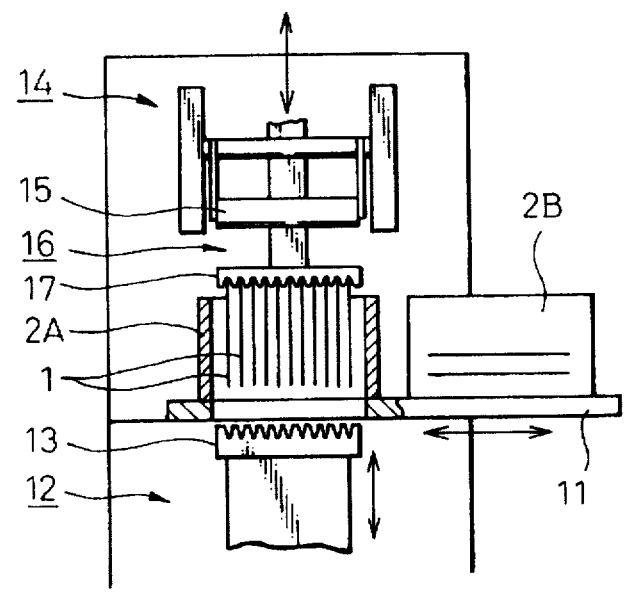

Referring to the drawings, a first embodiment of a wafer transferring apparatus according to the present invention will be described with reference to FIGS. 1(A) and 1(B), side and front views of the first embodiment, and FIG. 2, a view illustrating an operation of the first embodiment.

In these drawings, there are wafers or wafer-like materials 1, a first carrier 2A, a second carrier 2B, a reciprocating table 11, a wafer transporting section 12, a wafer holding section, and a restricting section 16 for preventing the wafers from being inclined.

The first and second carriers 2A and 2B may be made of any material and may have various shapes depending on their use. In general, a carrier used for transportation may be advantageously made of polypropylene resin and a carrier used for a process treatment may be advantageously made of silica glass or fluororesin.

Figure 2:
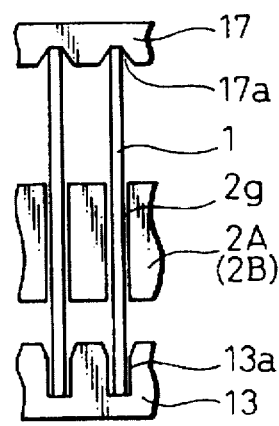
FIG. 2 is a view illustrating an operation of the first embodiment of a wafer transferring apparatus shown in FIGS. 1(A) and 1(B)

Each of these first and second carriers 2A and 2B has a plurality of (for example, twenty five) guide grooves 2g, each having Y-shaped cross section as shown in FIG. 2, for accommodating a plurality of wafers 1 in their upright standing positions in parallel to each other at a predetermined pitch. The pitch of guide grooves 2g, i.e., the pitch of wafers, is constant. Also, each of these first and second carriers 2A and 2B has a central bottom opening (20A) under the wafers 1 accommodated therein, through which opening the wafer transporting section 12 can be moved up and down.

The reciprocating table 11 has such a shape that the two carriers 2A and 2B are placed thereon at predetermined positions, respectively, and can be moved in the horizontal directions by a horizontal moving means (not shown). The reciprocating table 11 has an opening through which the wafer transporting section 12 can be moved up and down.

The reciprocating table 11 is also provided with an opening 11A, so that the wafer transporting section 12 can pass through the openings 11A and 20A.

The wafer transporting section 12 is provided at the upper end thereof with the wafer supporting member 13 which can be moved upward and downward by a lift (not shown). The wafer supporting member 13 is provided at the upper end thereof with a plurality of guide grooves 13a, each having Y-shaped cross section. The number and pitch of these guide grooves 13a are the same as those of guide grooves 2g of the first and second carriers 2A and 2B, respectively. The wafer transporting section 12 is located under the reciprocating table 11 at its home position.

The wafer holding section 14 is located above the wafer transporting section 12 and has a pair of wafer holding members 15. The pair of wafer holding members 15 can be moved toward and away from each other by a turning means (not shown). Each of the wafer holding members 15 has a plurality of guide grooves (not shown), each having Y-shaped cross section. The number and pitch of these guide grooves are the same as those of guide grooves of the first and second carriers 2A and 2B, respectively.

The wafer inclination restricting section 16 is provided with a member 17 for restricting the wafers from being inclined, which member 17 can be moved upward and downward by a lift (not shown). The wafer inclination restricting member 17 is provided at the lower end thereof with a plurality of guide grooves 17a, each having Y-shaped cross section. The number and pitch of these guide grooves 17a are the same as those of guide grooves 2g of the first and second carriers 2A and 2B, respectively. When the wafer inclination restricting member 17 is in its home position, it is located above the upper ends of the wafers accommodated in the carrier 2A or 2B and under the wafer holding members 15.

The operation of the wafer transferring apparatus and a method for transferring the wafers by using such an apparatus will now be described in detail.

First, both the first carrier 2A, i.e., the carrier accommodating a plurality of wafers 1 which are to be transferred therefrom, and the second carrier 2B, i.e., the carrier to which the above-mentioned plurality of wafers 1 are to be transferred, are placed on a reciprocating table 11, at their predetermined positions, in such a manner that the first carrier 2A is located at a predetermined position just above the wafer supporting member 13 in its home position.

Then, the wafer inclination restricting member 17 is lowered so that the upper, peripheral portions of the wafers 1 accommodated in the first carrier 2a are inserted deeply into the guide grooves 17a, respectively. Thus, the positions of the wafers, which might have been somewhat inclined, can be corrected. Then, the wafer supporting member 13 is raised from its home position so that, while the lower, peripheral portions of the wafers 1 are inserted into the guide grooves 13a, all of the wafers 1 in the first carrier 2A are moved upward in their upright standing states until they arrive at the wafer holding member 14. The wafer inclination restricting member 17 is also moved upward at the same speed as the wafer supporting member 13 since the wafer supporting member 13 moves the wafers 1 upward and stops simultaneously with the wafer supporting member 13, while the upper, the peripheral portions of the wafers 1 are inserted into the guide grooves 17a.

Then, the pair of wafer holding members 15 turn from the respective sides of the wafers 1 toward the lower sides thereof, so that the lower, peripheral portions of the wafers 1 are inserted into the respective guide grooves of the wafer holding members 15, which hold the wafers in their upright state. Then, the wafer supporting member 13 is moved downward to its home position. The wafer inclination restricting member 17 remains behind, while the upper, peripheral portions of the wafers 1 are inserted into the guide grooves 17a.

The reciprocating table 11 is, then moved so that the second carrier 2B comes into a predetermined position where the first carrier 2A was. The wafer supporting member 13 is, then, raised again and stopped at a position where the wafer supporting member 13 comes into contact with the wafers 1. Then, the pair of wafer holding members 15 retract to the respective sides of the wafers 1. Thus, all of the wafers 15 come to be held by the wafer holding member 14 in their upright state. The wafer inclination restricting member 17 is still stayed, while the upper, peripheral portions of the wafers 1 are inserted into the guide grooves 17a.

In this state, the wafer supporting member 13 is lowered with the wafer inclination restricting member 17. On the way of lowering, the wafer inclination restricting member 17 is first stopped at its home position. Then, the wafers 15 are caught by the second carrier 2B and the wafer supporting member 13 is finally returned to its home position. Thus, the transfer of wafers is completed.

According to the wafer transferring apparatus of this embodiment, even if the peripheral portions of the wafers 1 are in contact with the side walls of the guide grooves 2g of the carrier 2A, the V or Y-shaped grooves 17a of the wafer inclination restricting member 17 correct the positions of the wafers 1 to move them away from the side walls of the guide grooves 2g before the wafer supporting member 13 come into contact with, and pushes, the wafers 1. Therefore, the surfaces of the wafers 1 are not scuffed or damaged.

FIG. 2 shows the state that the positions of the wafers are fully and completely corrected. However, sufficient effects can be obtained even if the positions are only partially corrected.

A second embodiment of a wafer transferring apparatus according to the present invention will now be described with reference to FIGS. 3(A) and 3(B), side and front views of the second embodiment, and FIG. 4, a view illustrating an operation of this second embodiment. In these drawings, the same or corresponding parts as in the first embodiment shown in FIGS. 1(A), 1(B) and 2 are denoted by the same or corresponding reference numerals. In this embodiment, reference numeral 18 denotes a wafer pushing member.

In the second embodiment, the wafer inclination restricting section 16 is provided at the lower end thereof with the wafer pushing member 18 in place of the wafer inclination restricting member 17 in the first embodiment.

The wafer pushing member 18 has no guide grooves, but is shaped as a bar (such a circular bar), at least an outer layer thereof being made of relatively soft or elastic material, such as polypropylene resin.

The operation of the second embodiment is the same as the first embodiment, except that the upper, peripheral portions of the wafers 1 come only slightly into contact with the wafer pushing member 18 when the wafers 1 are moved upward.

As shown in FIG. 4, even if the peripheral portions of the wafers 1 are in contact with the side walls of the guide grooves 2g of the carrier 2A, when the wafers 1 are accommodated therein, the wafers are prevented from being any more inclined, by pushing the upper peripheral portions of the wafers 1 with the wafer pushing member 18. Thus, when the wafer supporting member 13 come into contact with the wafers 1 and push, the wafers 1 from the carrier 2A, the peripheral portions of the wafers 1 are moved away from the guide grooves 2g. Thus, the surfaces of the wafers 1 are prevented from being scuffed or damaged.

It should be understood by those skilled in the art that the foregoing description relates to only some preferred embodiments of the disclosed invention, and that various changes and modifications may be made to the invention without departing from the spirit and scope thereof.

What we claim is:

1. A wafer transferring apparatus for transferring a plurality of wafer-like materials from a first carrier to a second carrier, while the materials are maintained in their predetermined upright arrangement parallel to each other at a predetermined pitch, said apparatus comprising:

first and second carriers each having means for accommodating a plurality of wafer-like materials in a predetermined upright arrangement;

a transporting section having a supporting means provided with a plurality of guide grooves arranged at a pitch the same as the predetermined pitch for moving up and down said plurality of materials between a lowered position and a raised position, said guide grooves of said supporting means being engaged with first peripheral portions of the respective materials when said materials are moved upward or downward by said transporting section;

a holding section for temporarily holding said plurality of materials when said plurality of materials are in their raised position; and an inclination restriction means provided with means for restricting second peripheral portions of the respective materials to prevent said materials from being inclined when said materials are moved upward or downward by said transporting section, said inclination restriction means being simultaneously movable upward and downward with the supporting means;

wherein each of said first and second carriers has a central bottom opening through which said supporting means can be moved up and down, and wherein said first and second peripheral portions are lower and upper peripheral portions, respectively, of the respective materials.

2. An apparatus as set forth in claim 1, wherein said inclination restricting means is provided with a plurality of guide grooves arranged at a pitch the same as said predetermined pitch, so that said guide grooves of the inclination restricting means are engaged with the upper peripheral portions of the respective materials to prevent said materials being inclined when said materials are moved upward or downward by said transporting section.

3. An apparatus as set forth in claim 1, wherein said inclination restricting means is provided with a rod-like pushing means, so that said rod-like pushing means is in contact with the upper peripheral portions of the respective materials to prevent said materials being inclined when said materials are moved upward or downward by said transporting section.

4. An apparatus as set forth in claim 3, wherein said rod-like pushing means is made, at least at an outer portion thereof, of an elastic material.

5. An apparatus as set forth in claim 1, further comprising a horizontal table, upon which said first and second carriers are disposed, for horizontally moving said first and second carriers to replace one with another at a predetermined position by moving said table horizontally with respect to said holding section.

6. A method for transferring a plurality of wafer-like materials from a first carrier to a second carrier, while said materials are maintained in their predetermined upright arrangements parallel to each other at a predetermined pitch, said method comprising the following steps of:

moving said plurality of materials upward from said first carrier to their raised position by a supporting means providing with a plurality of guide grooves which are engaged with first peripheral portions of the respective materials when said materials are moved upward;

temporarily holding said plurality of materials when said plurality of materials are in their raised position;

moving said plurality of materials downward from their raised position to said second carrier by said supporting means in such a manner that said guide grooves are engaged with first peripheral portions of the respective materials when said materials are moved downward; and restricting second peripheral portions of the respective materials while said materials are moved to prevent said materials from being inclined as said materials are moved upward or downward by said supporting means.

7. A method as set forth in claim 6, wherein said supporting means is moved up and down through a central bottom opening of said first and second carriers, and said first and second peripheral portions are lower and upper peripheral portions, respectively, of the respective materials.

8. A method as set forth in claim 7, wherein said upper peripheral portions of the respective materials are engaged with a plurality of guide grooves of an inclination restricting means when said materials are moved upward or downward.

9. A method as set forth in claim 7, wherein said upper peripheral portions of the respective materials are in contact with rod-like pushing means when said materials are moved upward or downward.

10. A method as set forth in claim 7, wherein said method comprises the following steps of:

placing said first carrier in which said plurality of wafer-like materials are accommodated in said predetermined upright arrangements at a predetermined position, before said plurality of materials moved upward; and placing said second carrier in which no materials are accommodated in the position of said first carrier after said plurality of materials are moved upward and before said plurality of materials are moved downward.

11. A wafer transferring apparatus for transferring a plurality of wafer-like materials from a first carrier to a second carrier, while the materials are maintained in their predetermined upright arrangement parallel to each other at a predetermined pitch, said apparatus comprising:

first and second carriers, each having a plurality of left and right spacers for accommodating a plurality of wafer-like materials in a predetermined upright arrangement;

a transporting section having a plurality of guide grooves arranged at a pitch the same as the predetermined pitch for moving up and down said plurality of materials between a lowered position and a raised position, said guide grooves being engaged with first peripheral portions of the respective material when said materials are moved upward or downward by said transporting section;

a holding section for temporarily holding said plurality of materials when said plurality of materials are in their raised position, said holding section being disposed above the transporting section and having a pair of wafer holding members, each holding member having a plurality of guide grooves, and each holding member disposed such that each can be rotatably moved toward and away from each other;

an inclination restriction means provided with means for restricting second peripheral portions of the respective materials to prevent said materials from being inclined when said materials are moved upward or downward by said transporting section, said inclination restriction means being simultaneously movable upward and downward with the supporting means;

wherein each of said first and second carriers has a central bottom opening through which said supporting means can be moved up and down, and wherein said first and second peripheral portions are lower and upper peripheral portions, respectively, of the respective materials.

* * * * *